US007613250B2

(12) United States Patent
Sasaki et al.

(10) Patent No.: US 7,613,250 B2
(45) Date of Patent: Nov. 3, 2009

(54) DISTORTION COMPENSATION APPARATUS

(75) Inventors: Takao Sasaki, Kawasaki (JP); Masayuki Oonuki, Kawasaki (JP); Hiromi Miyamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 495 days.

(21) Appl. No.: 11/165,866

(22) Filed: Jun. 24, 2005

(65) Prior Publication Data

US 2006/0198464 A1 Sep. 7, 2006

(30) Foreign Application Priority Data

Mar. 7, 2005 (JP) .............................. 2005-062997

(51) Int. Cl.
*H04K 1/02* (2006.01)
(52) U.S. Cl. ........................ 375/296; 375/297; 375/298; 375/346; 455/126
(58) Field of Classification Search ................. 375/346, 375/296, 297, 298; 455/126
See application file for complete search history.

(56) References Cited

U.S. PATENT DOCUMENTS

| 6,125,266 | A | * | 9/2000 | Matero et al. ................ 455/126 |
| 6,836,517 | B2 | | 12/2004 | Nagatani et al. |
| 7,194,043 | B2 | * | 3/2007 | Ma ............................. 375/296 |
| 7,330,517 | B2 | * | 2/2008 | Taler et al. ................... 375/297 |
| 2001/0007435 | A1 | | 7/2001 | Ode et al. |
| 2001/0051504 | A1 | | 12/2001 | Kubo et al. |
| 2003/0118126 | A1 | * | 6/2003 | Moon et al. .................. 375/298 |
| 2003/0223509 | A1 | * | 12/2003 | Ma ............................. 375/296 |
| 2005/0111574 | A1 | * | 5/2005 | Muller et al. ................ 375/296 |
| 2005/0111575 | A1 | * | 5/2005 | Taler et al. ................... 375/297 |
| 2005/0129141 | A1 | * | 6/2005 | Lee ............................. 375/298 |
| 2005/0163268 | A1 | * | 7/2005 | McCallister ................ 375/346 |

FOREIGN PATENT DOCUMENTS

| GB | 2 283 629 | 5/1995 |
| JP | 2001-189685 | 7/2001 |

OTHER PUBLICATIONS

3GPP TS 25.104, $3^{rd}$ Generation Partnership Project; Technical Specification Group Radio Access Network; Base Station (BS) radio transmission and reception (FDD).
European Search Report dated Jun. 21, 2007, from the corresponding European Application.

* cited by examiner

*Primary Examiner*—Sudhanshu C Pathak
(74) *Attorney, Agent, or Firm*—Fujitsu Patent Center (57) ABSTRACT

Provided is a distortion compensation apparatus which can correspond to the number of carriers adaptively. The apparatus includes a distortion compensation processing circuit multiplying an input signal by a distortion compensation coefficient; a distortion compensation coefficient storage storing the distortion compensation coefficient correspondingly to the input signal power; a distortion compensation coefficient calculator calculating an update value of the distortion compensation coefficient stored in the distortion compensation coefficient storage, based on the input signal and a feedback signal being feedbacked from the output side of a distortion device; a digital filter inputting the output of the distortion compensation processing circuit. Further is included a modifying unit, which modifies the passband of the digital filter so as to reduce a distortion compensation control bandwidth in the predistortion portion, in response to the reduction of the number of carriers in the input signal.

5 Claims, 7 Drawing Sheets

A conventional transmission signal output spectrum, in case of 4 carriers.

FIG. 7 (RELATED ART)

The conventional transmission signal output spectrum, in case of 2 carriers.

A transmission signal output spectrum in case of 2 carriers, according to the present invention.

DISTORTION COMPENSATION APPARATUS

BACKGROUND OF THE INVENTION

1. Field of the Invention

The present invention relates to a distortion compensation apparatus, and more particularly a distortion compensation apparatus which obtains a differential signal between a reference signal, that is, a transmission signal and a feedback signal, calculates a distortion compensation coefficient so as to reduce the differential signal by use of an adaptive algorithm, updates a distortion compensation coefficient having been stored using the above-calculated distortion compensation coefficient, and performs distortion compensation onto the transmission signal based on the above obtained distortion compensation coefficient.

2. Description of the Related Art

In recent years, high-efficient digital transmission has been adopted in radio communication. When multilevel phase modulation is adopted in the radio communication, it is an important technique to suppress nonlinear distortion by linearizing the amplification characteristic of a power amplifier on the transmission side, thereby reducing adjacent channel leak power.

Also, when it is intended to improve power efficiency using an amplifier having a degraded linearity, a technique for compensating nonlinear distortion caused by the degraded linearity is essentially required.

Figure 1:
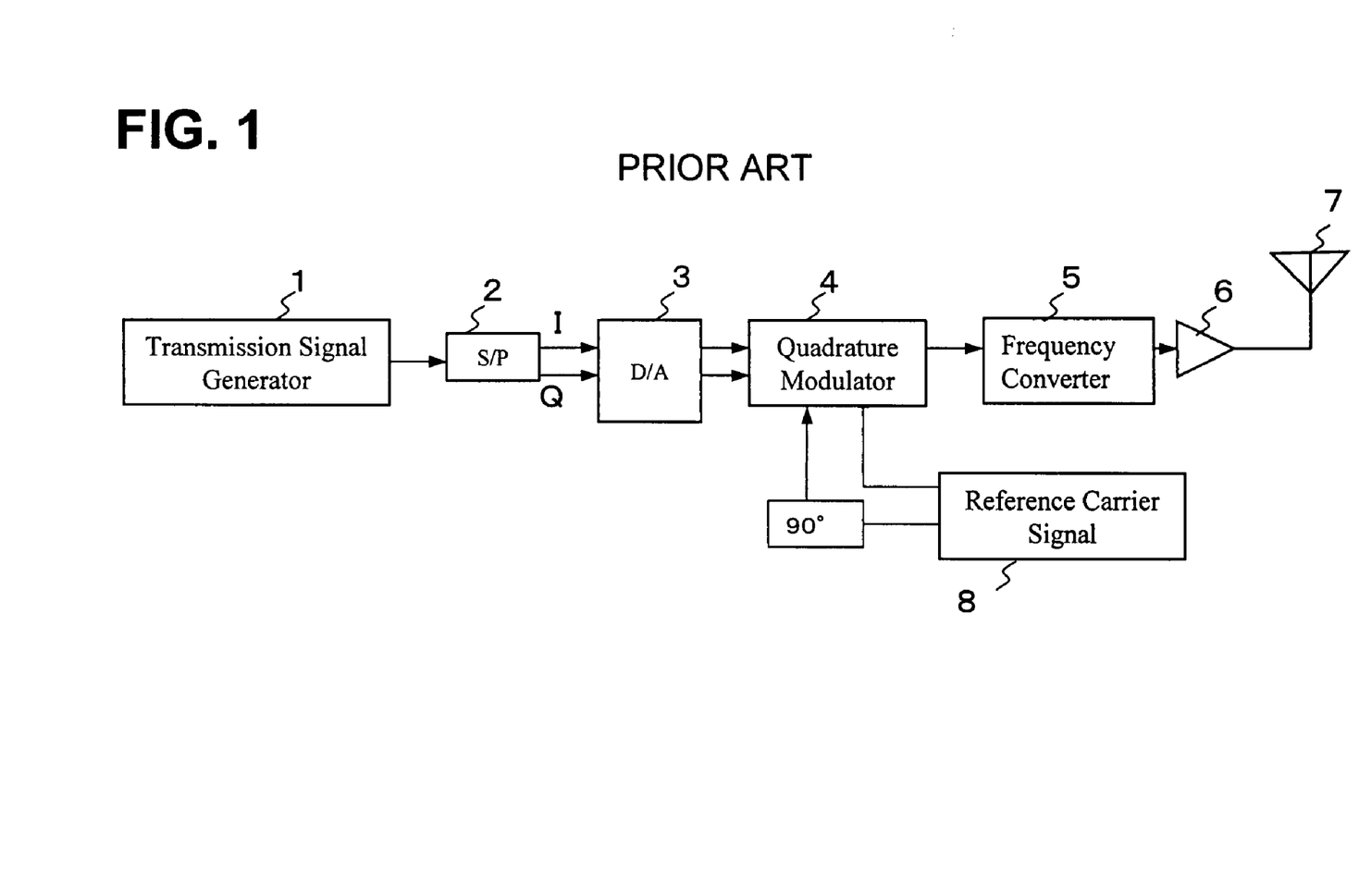
FIG. 1 shows a block diagram illustrating one example of transmission equipment in the conventional radio equipment.

FIG. 1 shows an exemplary block diagram of transmission equipment in the conventional radio equipment. A transmission signal generator 1 outputs a digital serial data sequence. A serial-to-parallel (S/P) converter 2 then converts the digital data sequence into two series, in-phase component signals (I-signals) and quadrature component signals (Q-signals), by alternately distributing the digital data sequence on a bit-by-bit basis.

A digital-to-analog (D/A) converter 3 converts the I-signal and the Q-signal into an analog baseband signal, respectively, so as to input into a quadrature modulator 4. This quadrature modulator 4 multiplies the input I-signal and Q-signal (a baseband transmission signal) by a reference carrier wave 8, and a carrier wave phase-shifted by 90° from the reference carrier wave 8, and adds the multiplied results, thus performing orthogonal transformation, and outputs the above signal.

A frequency converter 5 mixes the quadrature modulation signal with a local oscillation signal, and converts the mixed signal into a radio frequency. A transmission power amplifier 6 performs power amplification of the radio frequency signal being output from frequency converter 5, and radiates to the air from an antenna 7.

Figure 2:
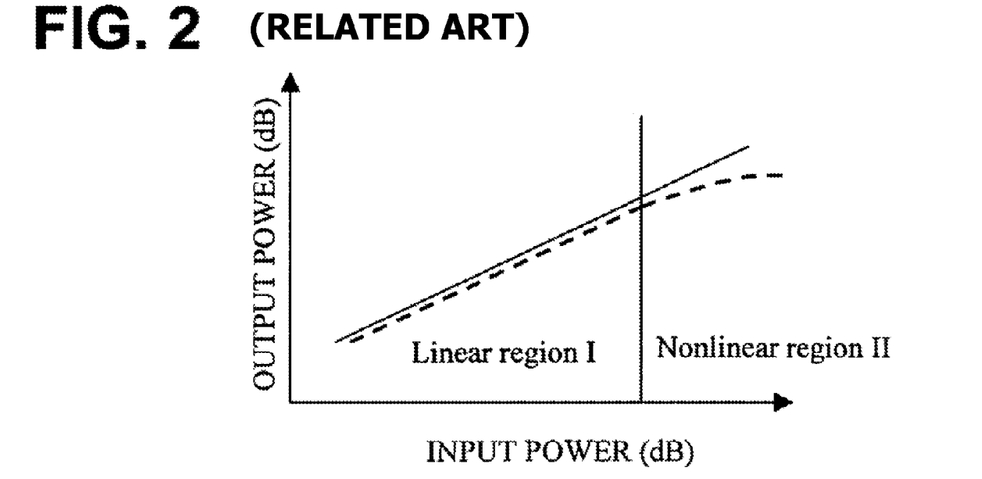
FIG. 2 shows a diagram illustrating input/output characteristics (having a distortion function f(p)) of a transmission power amplifier.

Here, in the mobile communication using W-CDMA, etc., transmission equipment power is substantially large, as much as 10 mW to several tens of mW, and the input/output characteristic (having a distortion function f(p)) of transmission power amplifier 6 shows non-linearity, as shown by the dotted line in FIG. 2. This nonlinear characteristic produces a nonlinear distortion. As shown by the solid line (b) in FIG. 3, the frequency spectrum in the vicinity of a transmission frequency $f_0$ comes to have a raised sidelobe, shifted from the characteristic shown by the broken line (a) in FIG. 3. This produces a leak to adjacent channels, and adjacent interference. Namely, due to the nonlinear distortion shown in FIG. 2, the leak power of the transmission wave to the adjacent frequency channels becomes large, as shown in FIG. 3.

Figure 3:
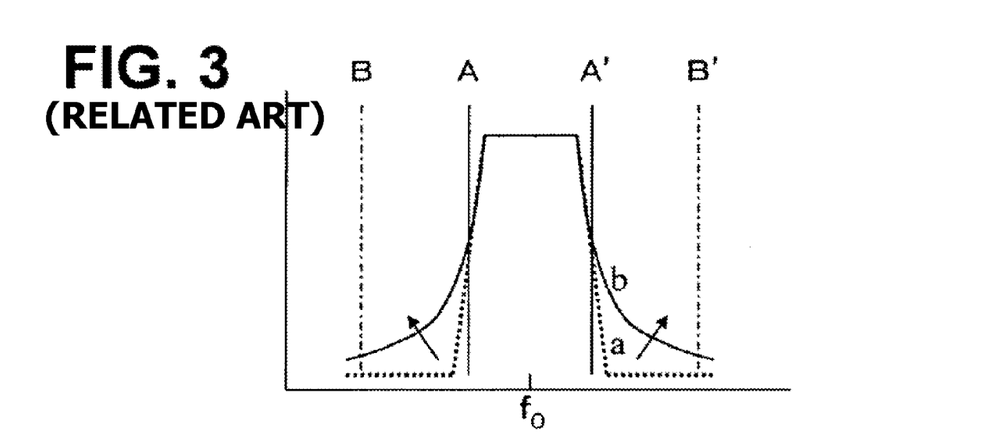
FIG. 3 shows a diagram illustrating nonlinear distortion produced by a nonlinear characteristic.

An ACPR (adjacent channel power ratio) represents the magnitude of leak power, being defined as a ratio of leak power to adjacent channels, which corresponds to a spectrum area in the adjacent channels sandwiched between the lines B and B' in FIG. 3, to the power in the channel of interest, which corresponds to a spectrum area between the lines A and A'. Such the leak power affects other channels as noise, and degrades the communication quality of the channel of interest. For this reason, a strict regulation has been established.

The leak power is substantially small in a linear region of, for example, a power amplifier (refer to a linear region I in FIG. 2), and is substantially large in a nonlinear region II. Accordingly, in order to obtain a high-output transmission power amplifier, the linear region I has to be widened. However, this requires an amplifier having a larger capacity than is actually needed, which causes a disadvantageous problem in both cost and size of the apparatus. To cope with this problem, it has been applied to add a distortion compensation function to radio equipment so as to compensate for the transmission power distortion.

Figure 4:
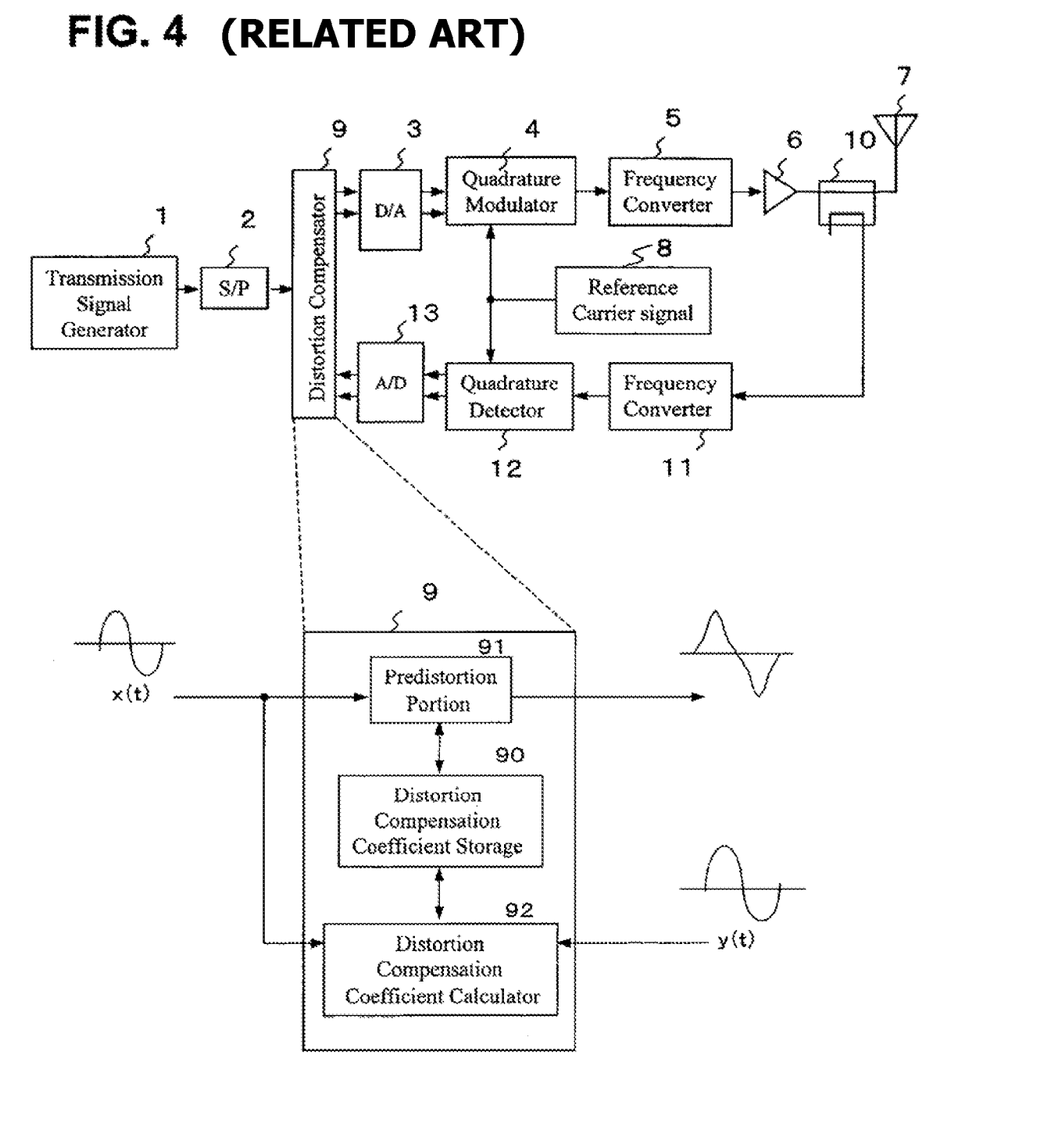
FIG. 4 shows a block diagram of transmission equipment having a digital nonlinear distortion compensation function using a DSP (digital signal processor).

FIG. 4 shows a block diagram of transmission equipment having a digital nonlinear distortion compensation function by use of a DSP (digital signal processor). A digital data group (transmission signals) transmitted from transmission signal generator 1 is converted into two series, I-signals and Q-signals, in S/P converter 2, and then input to a distortion compensator 9 structured of the DSP.

As shown in the lower part of FIG. 4 in enlargement, distortion compensator 9 includes: a distortion compensation coefficient storage 90 storing a distortion compensation coefficient h(pi) corresponding to the power level pi (where i=0-1023) of a transmission signal x(t); a predistortion portion 91 performing a distortion compensation process (predistortion) onto the transmission signal, using the distortion compensation coefficient h(pi) according to the transmission signal power level; and further, a distortion compensation coefficient calculator 92 for updating a distortion compensation coefficient by comparing the transmission signal x(t) with a demodulation signal (a feedback signal) y(t) demodulated in a quadrature detector, which will be described later, and calculating the distortion compensation coefficient h(pi) so that the difference of the above compared values becomes zero.

The signal to which distortion process is performed in distortion compensator 9 is input into D/A converter 3. This D/A converter 3 converts the input I-signal and Q-signal into analog baseband signals, and inputs the converted signals into quadrature modulator 4. Quadrature modulator 4 performs quadrature modulation by multiplying the input I-signal and Q-signal by a reference carrier wave 8 and a carrier wave being phase-shifted by 90° from reference carrier wave 8, respectively. Quadrature modulator 4 performs quadrature modulation by adding the multiplication result, and outputs the modulated signal.

A frequency converter 5 performs frequency conversion by mixing the quadrature modulation signal with a local oscillation signal. A transmission power amplifier 6 performs power amplification of the radio frequency signal being output from frequency converter 5, and radiates to the air from antenna 7.

A portion of the transmission signal is input to a frequency converter 11 via a directional coupler 10, and input into a quadrature detector 12 after being frequency converted by the above frequency converter 11. Quadrature detector 12 performs quadrature detection by multiplying the input signal by a reference carrier wave, and by a signal being phase-shifted by 90° from the reference carrier wave, respectively. Thus, the baseband I-signal and Q-signal on the transmission side are reproduced, and then input into an analog-to-digital (A/D) converter 13.

A/D converter 13 converts the input I-signal and Q-signal into digital signals, and inputs into distortion compensator 9. Through the adaptive signal processing using an LMS (least-mean-square) algorithm, in distortion compensation coefficient calculator 92 of distortion compensator 9, the pre-compensated transmission signal is compared with the feedback signal being demodulated in quadrature detector 12. Then, distortion compensator 9 calculates the distortion compensation coefficient h(p1) so that the difference of the above comparison values becomes zero, and updates the above-obtained coefficient having been stored in distortion compensation coefficient storage 90. Through the repetition of the calculations above, nonlinear distortion in transmission power amplifier 6 is suppressed, and adjacent channel leak power is reduced.

Figure 5:
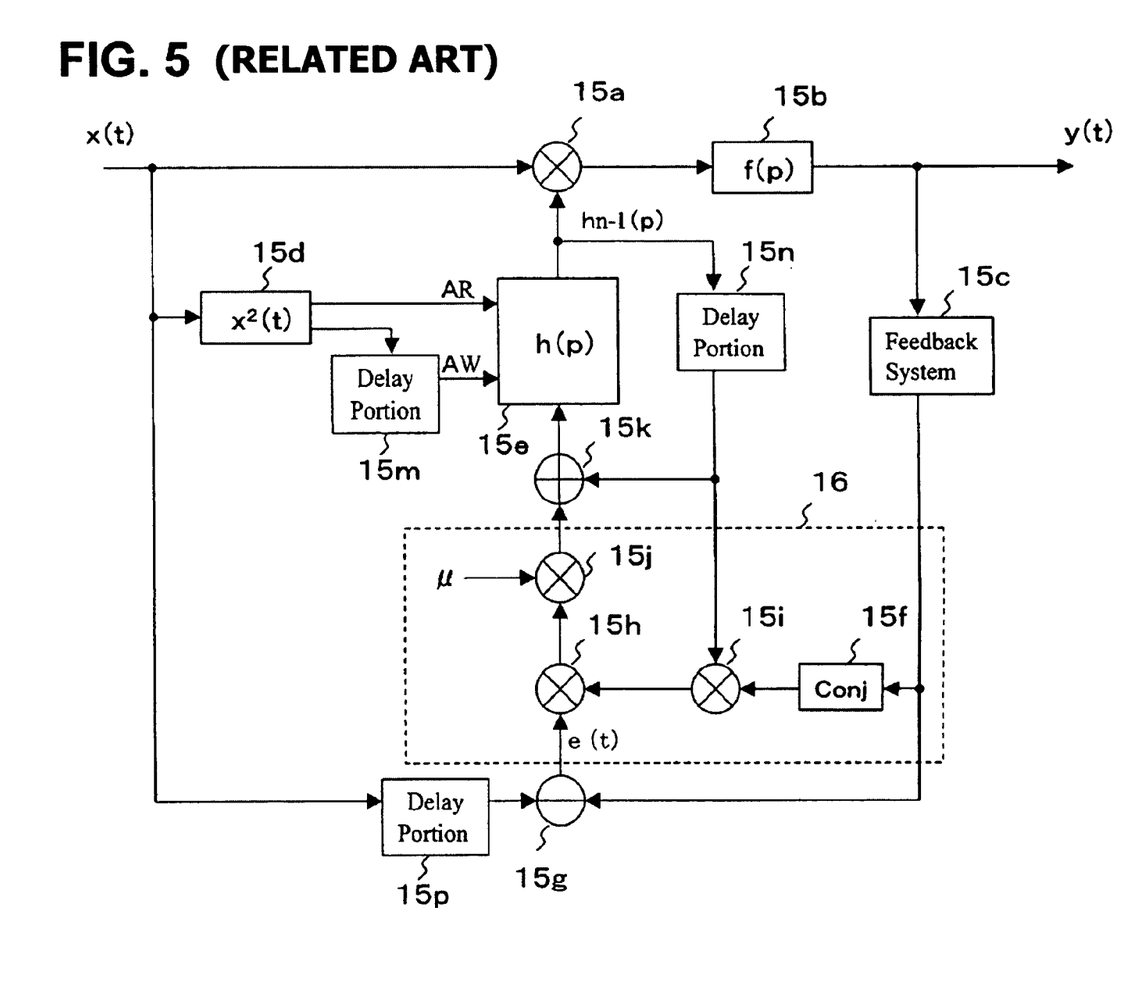
FIG. 5 shows an explanation diagram in case distortion compensation processing is performed using an adaptive LMS in a distortion compensator 9.

FIG. 5 shows an explanation diagram when the distortion compensation processing is performed using the adaptive LMS algorithm in distortion compensator 9 shown in FIG. 4.

A symbol 15a is a multiplier for multiplying a transmission signal x(t) by a distortion compensation coefficient $h_{n-1}(p)$. This multiplier corresponds to the predistortion portion 91 shown in FIG. 4. Also, 15b is a transmission power amplifier having a distortion function f(p), and 15c is a feedback system in which feedback the output signal y(t) being output from transmission power amplifier 15b is performed. Also, 15d is a calculator (amplitude-power converter) for calculating a power p ($=x^2(t)$) of the transmission signal x(t), and 15e is a distortion compensation coefficient storage (which corresponds to distortion compensation coefficient storage 90 shown in FIG. 4) for storing the distortion compensation coefficients each corresponding to each power of the transmission signal x(t).

Distortion compensation coefficient storage 15e outputs a distortion compensation coefficient $h_{n-1}(p)$ corresponding to the power p of the transmission signal x(t). Distortion compensation coefficient storage 15e also updates a distortion compensation coefficient $h_{n-1}(p)$ with a distortion compensation coefficient $h_n(p)$ obtained through the LMS algorithm.

Further, 15f is a conjugate complex signal output portion, 15g is a subtractor outputting a difference e(t) between the transmission signal x(t) and the feedback demodulation signal y(t), 15h is a multiplier multiplying e(t) by u*(t), 15i is a multiplier multiplying $h_{n-1}(p)$ by y*(t), and 15j is a multiplier multiplying by a step size parameter μ, and 15k is an adder adding $h_{n-1}(p)$ to μe(t)u*(t). Also, 15m, 15n, 15p are delay portions by which a delay time D is added to the input signal. Here, the delay time D denotes the time duration from the time the transmission signal x(t) is input to the time the feedback demodulation signal y(t) is input to subtractor 15g.

Symbols 15f, 15h-15j constitute a calculation section 16. A signal y(t) is the signal after being distorted. The delay time D being set in delay portions 15m, 15n, 15p is determined so as to satisfy D=D0+D1, where D0 is the delay time in transmission power amplifier 15b, and D1 is the delay time in feedback system 15c.

When this delay time D cannot be set correctly, the distortion compensation function does not work effectively. Also, the greater the set error in the delay time is produced, the greater the leak power to the adjacent channels caused by the raised sidelobe becomes.

Using the above configuration, the following calculations are performed.

$h_n(p)=h_{n-1}(p)+\mu e(t)u^*(t)$ $e(t)=x(t)-y(t)$ $y(t)=h_{n-1}(p)x(t)f(p)$ $u(t)=x(t)f(p)=h_{n-1}(p)*y(t)$ $p=|x(t)|^2$

Here, x, y, f, h, u, e are complex numbers, and * denotes a conjugate complex number.

Through the above calculation processing, the distortion compensation coefficient h(p) is updated so as to minimize the differential signal e(t) between the transmission signal x(t) and the feedback demodulation signal y(t). Finally, the value converges to an optimal distortion compensation coefficient, so that the distortion of the transmission power amplifier is compensated.

As described above, the principle of the distortion compensation apparatus is that feedback detection of a carrier wave obtained after quadrature modulation of the transmission signal is performed, the amplitudes of the transmission signal and the feedback signal are compared after digital conversion, and a distortion compensation coefficient is updated real time based on the above comparison result. According to this nonlinear distortion compensation system, it is possible to reduce distortion, and leak power as well, even through the operation is performed in a nonlinear region with high output, and also to improve the power load efficiency.

Now, in regard to the above setting of the delay time in the prior application, the applicant of the present invention has proposed one method, which is disclosed in the official gazette of the Japanese Unexamined Patent Publication No. 2001-189685. The method disclosed in the above patent document 1 is outlined below: A correlation value is calculated varying the phases between a transmission signal x(t) and a feedback signal. Based on the maximum value of this correlation, a total delay time produced in a distortion device (transmission power amplifier), a feedback loop, etc. is determined. Then, the determined delay time is set in each delay circuit for timing adjustment in the distortion compensation apparatus.

As such, the distortion compensation operation is performed by the distortion compensation apparatus so as to reduce the difference between the transmission signal and the feedback signal. However, due to incompleteness of the distortion compensation, a noise being output from the transmission power amplifier posterior to the distortion compensation may possibly become larger than the noise being output therefrom prior to the distortion compensation, at the end region of the distortion compensation control bandwidth originally having a small distortion signal.

This signifies an undesirable increase of an unwanted wave transmitted at a frequency apart from the transmission bandwidth.

For example, according to a standard in regard to the unwanted wave specified in the specification TS25.104 issued by the 3GPP (3rd Generation Partnership Project), it is required to reduce an unwanted wave so as to be sufficiently small at the frequency having a distance of a predetermined frequency offset amount from the transmission bandwidth.

Figure 6:
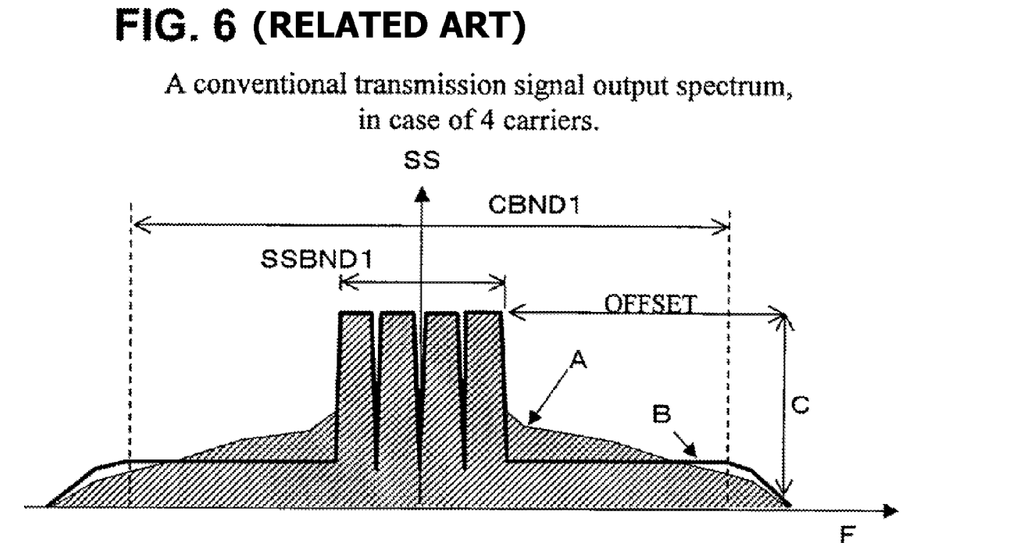
FIG. 6 shows a diagram explaining the standard of the unwanted wave, illustrating a transmission signal spectrum in case of four carriers.

FIG. 6 shows a diagram concretely explaining the standard of the unwanted wave, in which a transmission signal spectrum exemplifying a case of four carriers is illustrated. In FIG. 6, a frequency F is indicated on the horizontal axis, and a transmission intensity SS is indicated on the vertical axis. The transmission signal output spectrum is shown in the case four carriers are set.

As shown in this FIG. 6, transmission signals for four carriers are disposed within a transmission bandwidth SSBND1, and at the frequency having a distance of a frequency offset shown as OFFSET away from the end of the transmission bandwidth, it is required that an unwanted wave level shall be reduced for the value C or more from the level in the transmission bandwidth.

In FIG. 6, a spectrum A indicates the spectrum prior to the distortion compensation having the transmission bandwidth SSBND1 of four carriers, while a spectrum B indicates the spectrum posterior to the distortion compensation explained in regard to FIG. 5. The floor level in the end region of the transmission bandwidth SSBND1 of four carriers is decreased. On the other hand, the floor is widened in the spectrum.

However, even in the case the spectrum floor is widened, the unwanted wave is suppressed to a low level at the frequency having a distance of the frequency offset amount OFFSET specified in the standard of the unwanted wave, and thereby the standard is met.

Figure 7:
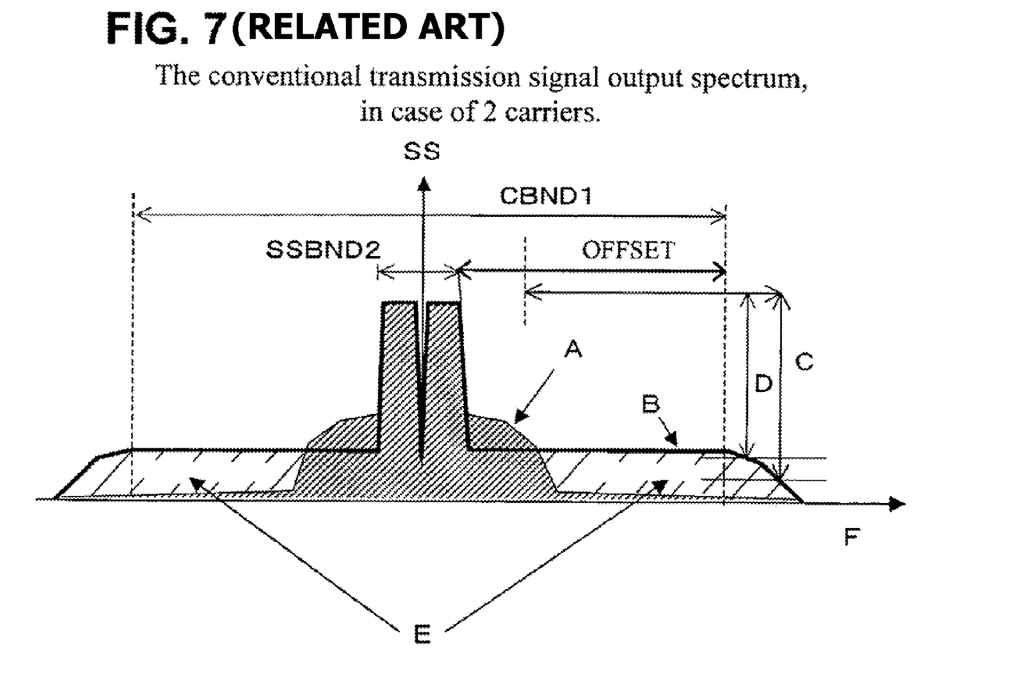
FIG. 7 shows a diagram illustrating a transmission signal output spectrum in case of two carriers.

Now, a case of setting the number of carriers less than four is considered in the following. FIG. 7 is a diagram illustrating a transmission signal output spectrum when the number of carriers is two. In the case of two carriers, a transmission signal bandwidth SSBND2 becomes narrower than the transmission signal bandwidth SSBND1 in the case of four carriers shown in FIG. 6. Meanwhile, when distortion compensation is performed on the spectrum A prior to the distortion compensation, undesirably, a floor E of a spectrum B becomes widened, similar to the case of four carriers.

Also, since the transmission signal bandwidth SSBND2 becomes narrower than the transmission signal bandwidth SSBND1 in the case of four carriers, the frequency having a distance of the frequency offset amount OFFSET specified in the standard of the unwanted wave is shifted to the left (nearer to the transmission bandwidth) as compared to FIG. 6. In this case, because of the influence of the widened floor E due to the distortion compensation, the unwanted wave level is increased at the frequency having a distance of the frequency offset amount specified in the standard of the unwanted wave. As a result, the specified condition that an unwanted wave level at the aforementioned frequency shall be reduced for the value C or more from the level in the transmission bandwidth is not met any more. Namely, the unwanted wave level has a value D, which is smaller than C, below the transmission bandwidth level.

As such, when the number of carriers (transmission bandwidth) is variable, the distortion compensation may produce an increased unwanted wave (inconformity to the standard of the unwanted wave), contrarily.

SUMMARY OF THE INVENTION

Accordingly, it is an object of the present invention to provide a distortion compensation apparatus, enabling suppression of an unwanted wave adaptively corresponding to the number of carriers (transmission bandwidth).

As a first aspect of the distortion compensation apparatus according to the present invention to solve the aforementioned problem, a distortion compensation apparatus includes: a predistortion portion performing distortion compensation processing to an input signal using a distortion compensation coefficient; a distortion compensation coefficient portion storing the distortion compensation coefficient correspondingly to the input signal power, based on the input signal prior to the distortion compensation and a feedback signal being feedbacked from the output side of a distortion device; and a controller for reducing a distortion compensation control bandwidth in the predistortion portion, corresponding to the reduction of the number of input signal carriers.

As a second aspect of the distortion compensation apparatus according to the present invention to solve the aforementioned problem, a distortion compensation apparatus includes: a distortion compensation processing circuit multiplying an input signal by a distortion compensation coefficient; a distortion compensation coefficient storage storing the distortion compensation coefficient correspondingly to the input signal power; a distortion compensation coefficient calculator calculating an update value of the distortion compensation coefficient stored in the distortion compensation coefficient storage, based on the input signal and a feedback signal being feedbacked from the output side of a distortion device; and a digital filter inputting the output of the distortion compensation processing circuit. The distortion compensation apparatus further include a unit for modifying the passband of the digital filter so as to reduce a distortion compensation control bandwidth in the predistortion portion, in response to the reduction of the number of carriers in the input signal. The modifying unit may include a memory storing a filter coefficient, and reads out, from the memory, the filter coefficient to be set for the digital filter passband corresponding to the number of carriers in the input signal, and sets the readout filter coefficient to the digital filter. The modifying unit may reduce a clock frequency for the distortion compensation apparatus, a D/A converter, an A/D converter, and a digital filter, in response to the reduction of the number of carriers in the input signal.

As a third aspect of the distortion compensation apparatus according to the present invention to solve the aforementioned problem, the distortion device includes a controller controlling to reduce a signal bandwidth to be input to the amplifier, when a signal transmission bandwidth is reduced.

Further scopes and features of the present invention will become more apparent by the following description of the embodiments with the accompanied drawings.

DETAILED DESCRIPTION OF THE INVENTION

The preferred embodiment of the present invention is described hereinafter referring to the charts and drawings.

However, it is noted that the embodiment is provided for the sake of easy understanding, and accordingly, the technical scope of the present invention is not limited to the embodiments described below.

Figure 8:
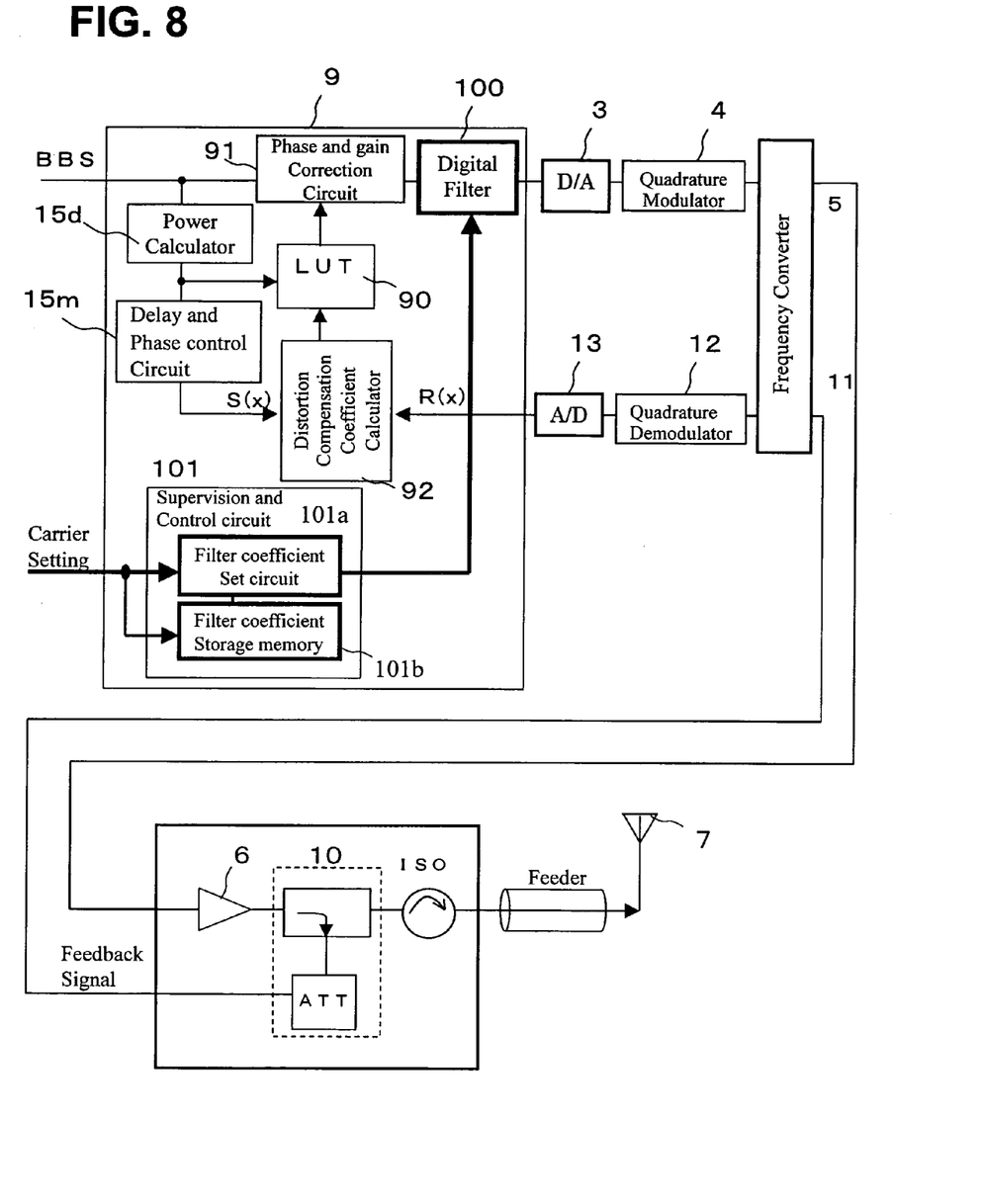
FIG. 8 shows a block diagram of transmission equipment having a digital nonlinear distortion compensation function in which the present invention is applied.

FIG. 8 is a block diagram of transmission equipment having a digital nonlinear distortion compensation function in which the present invention is applied. In this FIG. 8, like reference symbols refer to the like functional portions shown in FIGS. 4 and 5.

In FIG. 8, as a configuration example, a distortion compensation coefficient storage 90 is constituted of a look-up table, which is accessed using an input signal power value obtained in a power calculator 15d as an address.

A distortion compensation coefficient calculator 92 is a functional portion for obtaining an update value of a distortion compensation coefficient to be stored in look-up table 90, based on the difference of a transmission signal S(x), a feedback signal R(x) and the correlation value therebetween. Distortion compensation coefficient calculator 92 includes a subtractor 15g and a calculation section 16, as shown in FIG. 5.

Also, in FIG. 8, a feedback system 15 shown in FIG. 5 corresponds to a feedback route beginning from an output of a power amplifier 6, and including frequency converter 11, demodulator 12 and A/D converter 13, etc., via a directional coupler 10.

A distortion compensation apparatus 9 shown in FIG. 8 includes a supervision and control circuit 101 so as to enable variable setting of a pass bandwidth of a digital filter 100 based on a carrier set signal.

The number of transmission carriers transmitted from a base station is input and set into a base station (a transmission parameter set section provided therein) as a transmission parameter, when the base station is newly installed or a system change is performed. As such, according to the number of transmission carriers being set in the base station, a carrier set signal is input to supervision and control circuit 101.

Here, also by operating an operation section (not shown) provided on distortion compensation apparatus 9, it is possible to control to change setting of a filter coefficient to the supervision and control circuit.

Further, though a concrete chart is not shown in FIG. 8, supervision and control circuit 101 also has functions of receiving input signal power information from power calculator 15d, supervising a state of the transmission equipment, and setting control parameters for a delay and phase control circuit 15m based on the correlation value between the input transmission signal and the feedback signal, as described in the official gazette of the Japanese Unexamined Patent Publication No. 2001-189685 (Patent document 1).

Moreover, supervision and control circuit 101 includes a filter coefficient set circuit 101a, to which a carrier set signal is input either from the transmission parameter set section of the base station, or through the operation from the operation section. Filter coefficient set circuit 101a has a function of referring to a table in a filter coefficient storage memory 101b, and reading out a corresponding filter coefficient from the table, based on the information of the number of carriers in the carrier set signal.

The filter coefficient corresponding to the information of the number of carriers in the carrier set signal, which is read out by filter coefficient set circuit 101a, is forwarded to a digital filter 100. Digital filter 100 functions as filter having a passband characteristic corresponding to the filter coefficient supplied thereto.

Namely, digital filter 100 controls the passband thereof by setting the internal circuit according to the supplied filter coefficient. For example, after a tap coefficient group is supplied as filter coefficients, digital filter 100 controls to obtain a desired passband by setting the supplied tap coefficients to the respective taps. With this, when the transmission bandwidth is made narrower according to the carrier set signal, digital filter 100 can be modified to have a narrower passband.

Figure 9:
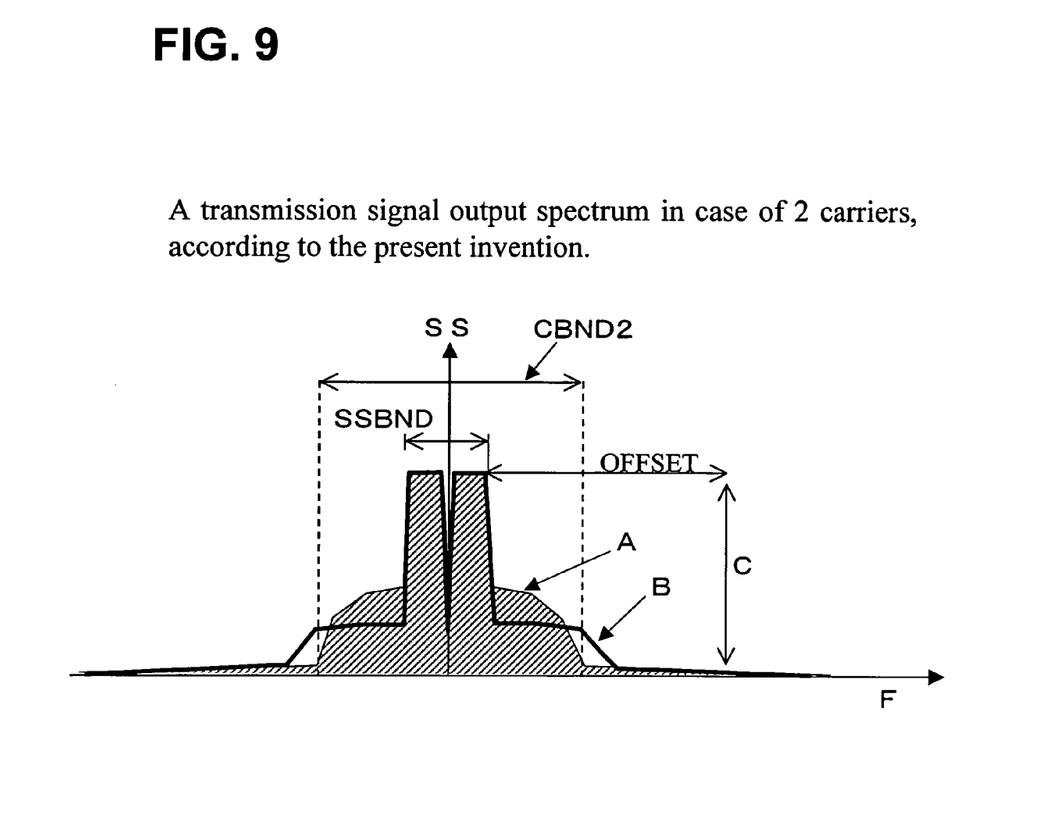
FIG. 9 shows a diagram explaining the effect of the present invention, illustrating a transmission signal output spectrum in case of two carriers, according to the present invention.

FIG. 9 is a diagram for explaining the pass band control, illustrating a transmission signal output spectrum in the case of two carriers, as an embodiment example.

As shown in FIG. 7, digital filter 100 is so controlled as to have a narrower passband when two carriers are used as transmission signal than the passband being set into digital filter 100 in the case four carriers are used as transmission signal. As a result, it is understood that a distortion compensation control bandwidth CBAND2 is narrower than a distortion compensation control bandwidth CBAND1.

The reduced passband in digital filter 100 produces a reduced control bandwidth for predistortion processing, which undesirably weakens a distortion suppression effect, and increases an unwanted wave. However, in the case that a relatively small number of carriers, such as two carriers, a wide control bandwidth contrarily produces an increased noise component due to the incompleteness in the distortion compensation, and the influence by the unwanted wave is strengthened. Therefore, it is advantageous to reduce the control bandwidth from the viewpoint of suppressing the increase of the unwanted wave.

Accordingly, as described above, the control bandwidth of the distortion compensation is reduced when the number of carriers is small, so as to suppress an increase of the unwanted wave bandwidth caused by the incompleteness of the distortion compensation.

Thus, in contrast to the output spectrum A of power amplifier 6 prior to the distortion compensation, it becomes possible to reduce an increase of the floor region in the output spectrum B posterior to the distortion compensation. In such a way, it becomes possible to sufficiently suppress the unwanted wave level at a frequency apart from the transmission bandwidth with a distance of a frequency offset being specified in the standard of the unwanted wave.

As having been described above, the present invention has been devised to reduce the distortion compensation control bandwidth, so as to suppress the increase of the floor portion in the spectrum posterior to the distortion compensation, when the number of set carriers is reduced.

In the above embodiment, an example of reducing the passband of digital filter 100 by setting a filter coefficient has been described, as a control means for reducing the distortion compensation control bandwidth. However, the present invention is not limited to the above example. It is also possible to reduce the filter passband by decreasing an operation clock frequency for a digital distortion compensation portion (distortion compensator, D/A converter, A/D converter, and digital filter).

According to the present invention, the distortion compensation control bandwidth can be controlled using a simple configuration, in response to either an increase or a decrease of the number of carriers being set in a transmitter. Even if the number of carriers decreases, an unwanted wave can easily be suppressed.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A distortion compensation apparatus comprising:
   a predistortion portion performing distortion compensation processing to an input signal using a distortion compensation coefficient;
   a distortion compensation coefficient portion storing the distortion compensation coefficient correspondingly to the input signal power, based on the input signal prior to the distortion compensation and a feedback signal being fed back from the output side of a distortion device; and
   a controller reducing a distortion compensation control bandwidth in the predistortion portion, corresponding to the reduction of the number of input signal carriers.

2. A distortion compensation apparatus comprising:
   a distortion compensation processing circuit multiplying an input signal by a distortion compensation coefficient;
   a distortion compensation coefficient storage storing the distortion compensation coefficient correspondingly to the input signal power;
   a distortion compensation coefficient calculator calculating an update value of the distortion compensation coefficient stored in the distortion compensation coefficient storage, based on the input signal and a feedback signal being fed back from the output side of a distortion device;
   a digital filter inputting the output of the distortion compensation processing circuit; and further,
   a controller modifying the passband of the digital filter so as to reduce a distortion compensation control bandwidth in the predistortion portion, in response to the reduction of the number of carriers in the input signal.

3. The distortion compensation apparatus according to claim 2,
   wherein the modifying unit includes a memory storing a filter coefficient, and reads out, from the memory, the filter coefficient to be set for the digital filter passband corresponding to the number of carriers in the input signal, and sets the readout filter coefficient to the digital filter.

4. The distortion compensation apparatus according to claim 2,
   wherein the modifying unit reduces a clock frequency for the distortion compensation apparatus, a D/A converter, an A/D converter, and a digital filter, in response to the reduction of the number of carriers in the input signal.

5. A distortion compensation method comprising:
   multiplying an input signal with a distortion compensation coefficient by a distortion compensation processing circuit;
   storing the distortion compensation coefficient correspondingly to the input signal power in a distortion compensation coefficient storage;
   calculating an update value of the distortion compensation coefficient stored in the distortion compensation coefficient storage, by a distortion compensation coefficient calculator, based on the input signal and a feedback signal fed back from a distortion device;
   inputting the output of the distortion compensation processing circuit to a digital filter; and
   modifying the passband of the digital filter so as to reduce a distortion compensation control bandwidth in the predistortion portion, in response to the reduction of the number of carriers in the input signal.

* * * * *